United States Patent [19]
Enniss et al.

[11] Patent Number: 5,529,633
[45] Date of Patent: Jun. 25, 1996

[54] APPARATUS FOR DEPOSITING A SUBSTANCE ON A ROTATING SURFACE

[75] Inventors: Dan O. Enniss, Sandy, Utah; Matthew Simpson, Sudbury, Mass.

[73] Assignee: Saint-Gobain/Norton Industrial Ceramics Corporation, Worcester, Mass.

[21] Appl. No.: 471,308

[22] Filed: May 11, 1995

Related U.S. Application Data

[62] Division of Ser. No. 175,586, Dec. 30, 1993.

[51] Int. Cl.⁶ .......................... C23C 16/00; C23C 16/50
[52] U.S. Cl. ............................. 118/723 R; 118/723 DC; 118/724; 118/730
[58] Field of Search ................ 118/723 R, 723 DC, 118/724, 730

[56] References Cited

U.S. PATENT DOCUMENTS

| | | | |
|---|---|---|---|
| 3,845,739 | 11/1974 | Erhart et al. | 118/730 |
| 4,471,003 | 9/1984 | Cann | 427/34 |
| 4,487,162 | 12/1984 | Cann | 118/723 |
| 5,063,031 | 11/1991 | Sato | 118/725 |
| 5,108,779 | 4/1992 | Gasworth | 427/255.1 |
| 5,204,144 | 4/1993 | Cann et al. | 427/569 |
| 5,226,383 | 7/1993 | Bhat | 118/730 |

*Primary Examiner*—Richard Bueker
*Attorney, Agent, or Firm*—Volker R. Ulbrich; Marty Novack

[57] ABSTRACT

An apparatus for depositing a substance includes a rotating mandrel assembly with a mandrel having a deposition surface exposed to the vapor so that the substance is deposited on the deposition surface and having a base having a plurality of radiator fins extending therefrom. A plurality of receptor fins interleave with the radiator fins and provide heat exchange to the receptor fins to cool the mandrel during deposition of the substance on the deposition surface of the mandrel.

18 Claims, 5 Drawing Sheets

APPARATUS FOR DEPOSITING A SUBSTANCE ON A ROTATING SURFACE

This is a divisional of copending application Ser. No. 08/175,586 filed on Dec. 30, 1993.

FIELD OF THE INVENTION

This invention relates to temperature control during material deposition and, more particularly, to controlling temperature of a substance experiencing high thermal energy fluxes while being deposited on a rotating surface.

BACKGROUND OF THE INVENTION

Techniques have long been known for depositing substances, such as layers of semiconductor material, using a plasma that is formed into a jet. For example, U.S. Pat. Nos. 4,471,003 and 4,487,162 disclose arc jet plasma deposition equipments which utilize a plasma for deposition of semiconductors and other materials. Ions and electrons are obtained by injecting an appropriate compound, such as a silicon compound, into an arc region, and a jet (or beam) is formed by utilizing magnetic fields to accelerate and focus the plasma. Recently, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes. A plasma of a hydrocarbon and hydrogen can be obtained using electrical arcing, and the resultant plasma focused and accelerated toward a substrate, using focusing and accelerating magnets, so that polycrystalline diamond film is deposited on the substrate. Reference can be made, for example, to U.S. Pat. No. 5,204,144 for description of an example of a type of plasma jet deposition that can be utilized to deposit synthetic diamond on a substrate.

In various commercial applications it is desirable to have relatively large size diamond films. In plasma jet deposition techniques there are various factors which limit the practical size of the deposition area that is active on a substrate at a particular moment. For example, when an arc is employed to generate the heated gas mixture in an arc jet plasma deposition system, the diameter of the beam can be limited by a number of factors. Since the cross-section of the plasma beam is generally limited in practical applications, the area on which it is desired to deposit a diamond film may be larger than the deposition beam. This means that it may be desirable to move the beam and the target substrate with respect to each other during the deposition process. This has been achieved by spinning the substrate during deposition, which helps to promote temperature uniformity over the substrate, as well as to attain larger area substrate coverage.

The hot plasma beam has a high power density and the substrate must be cooled during deposition to maintain an appropriate operating and deposition temperature. When operating with a stationary mandrel, a circulating liquid heat exchanger can readily be employed. However, it is much more difficult to provide cooling to a rotating mandrel. For example, techniques which require rotational seals and high temperature fluids tend to be expensive and unreliable. Also, precise temperature control may be lacking.

It is among the objects of the present invention to improve the ability to control temperature while depositing a substance on a rotating mandrel.

SUMMARY OF THE INVENTION

The present invention facilitates temperature control of a rotating mandrel during deposition of a substance on the mandrel, an example being deposition of synthetic diamond on a rotating mandrel using a plasma for chemical vapor deposition of the diamond.

In accordance with an embodiment of an apparatus of the invention for depositing a substance, there is provided a deposition chamber for containing heated constituents of the substance. A mandrel assembly is provided, and includes a mandrel mounted on a base. The mandrel assembly is rotatable on an axis, and the mandrel thereof has a surface in said chamber. The mandrel base has a first fin that extends outwardly from the rotation axis of the mandrel assembly. A translatable assembly, having a second fin that can overlap said first fin, is provided, the translatable assembly being translatable to change the extent of overlap of the first and second fins. Means are also provided for rotating the rotatable mandrel assembly, and means are provided for translating the translatable assembly. Heat exchange means are coupled with said translatable assembly. Means are provided for controlling the translation of the translatable assembly to control the thermal coupling between the mandrel assembly and the heat exchange means.

In a preferred embodiment of the invention, the mandrel base has a plurality of first fins that extend outwardly from the rotation axis of the mandrel assembly, and the translatable assembly has a plurality of second fins that interleave with the first fins, the translatable assembly being translatable to change the extent of interleaving of the first fins and second fins. In this embodiment, the base is generally cylindrical, and the first fins have an annular shape.

In accordance with an embodiment of the method of the invention, a technique is disclosed for depositing a substance, comprising the steps of: producing a vapor containing constituents of the substance; providing a rotating mandrel assembly that includes a mandrel which is exposed to the vapor and a base having a plurality of radiator fins extending therefrom; interleaving a plurality of receptor fins with the radiator fins; and providing heat exchange to the receptor fins to cool the mandrel during deposition of the substance on the mandrel. Moving the receptor fins controls the extent of interleave thereof with the radiator fins, so as to control temperature of the mandrel. In a disclosed embodiment, the temperature in the region of the mandrel is measured, and the moving of the receptor fins is in accordance with the measured temperature.

Further features and advantages of the invention will become more readily apparent from the following description when taken in conjunction with the accompanying drawings.

DETAILED DESCRIPTION

Figure 1:
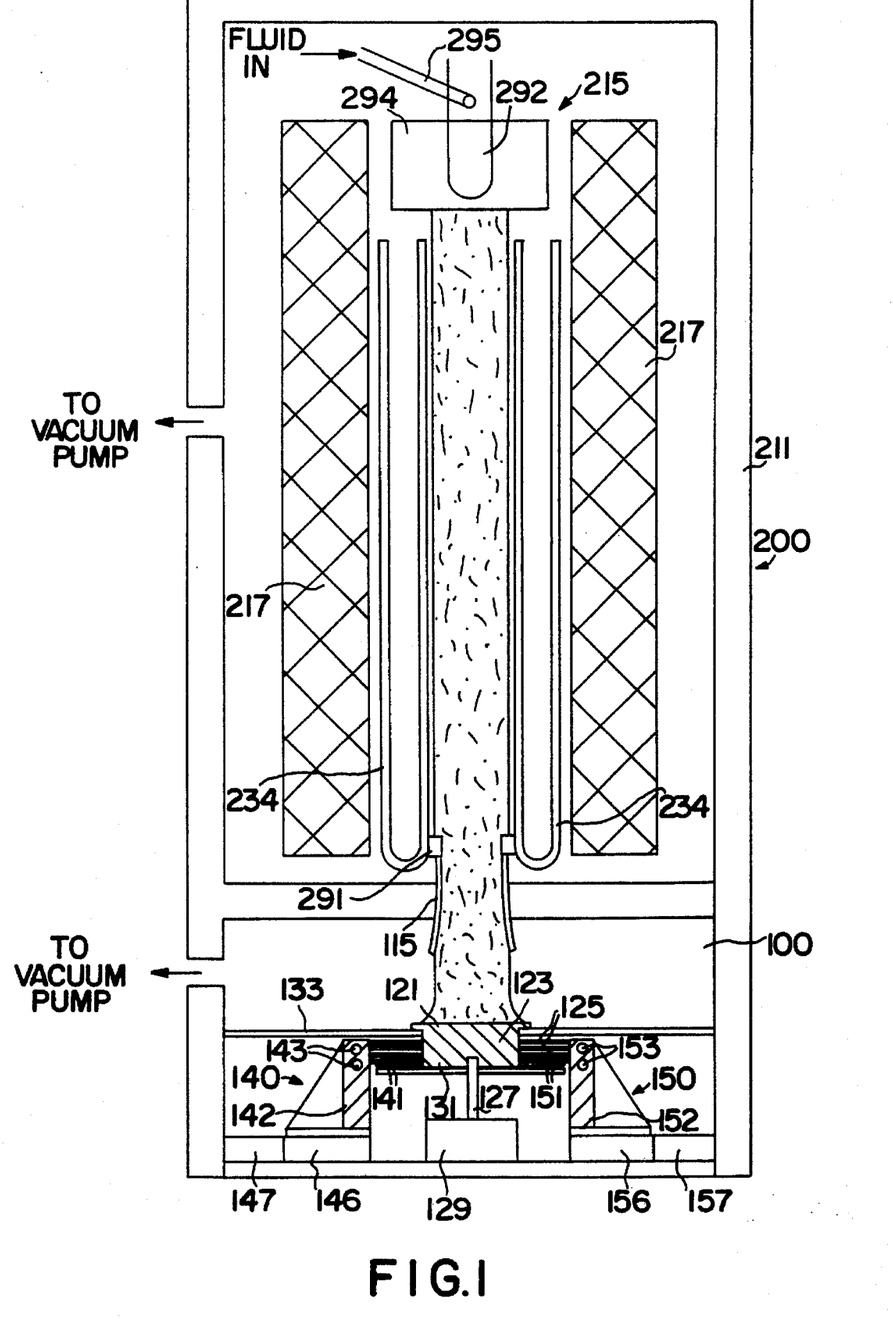
FIG. 1 is a schematic diagram, partially in block form, of an apparatus in accordance with the invention, and which can be used to practice the method of the invention.

Referring to FIG. 1, there is shown an embodiment of a chemical vapor deposition ("CVD") apparatus in accordance with the invention and which can be used to practice an embodiment of a method of the invention. A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated embodiment the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and accelerated and focused toward the deposition region. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including, for example, physical vapor deposition equipment, and other types of CVD plasma deposition equipment, can be used in conjunction with the features of the invention to be described.

Figure 2:
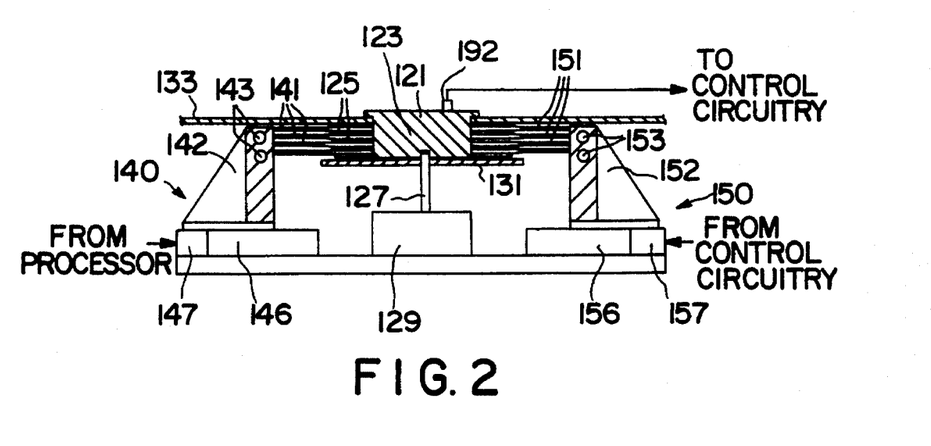
FIG. 2 illustrates a portion of the FIG. 1 apparatus, with receptor fins withdrawn to minimize cooling of the mandrel.

The deposition chamber of the present embodiment has a mandrel or platform 121 therein, the mandrel 121 being part of a mandrel assembly that also includes a base, which has a core 123 and fins 125 (see also FIG. 2). A shaft 127, which is coupled with a motor 129, defines the rotational axis of the mandrel assembly. The shaft can be formed, for example, of stainless steel. The core 123 and the stack of coaxial, parallel, spaced-apart fins 125, which serve primarily as radiator fins in this embodiment, may be formed of copper or other suitable material of relatively high thermal conductivity. The fins can have hyperbolic roots and be coated to increase their emissivity. One or more, preferably several (as shown), radiator fins can be employed. The motor 129, which can preferably be adjustable to a desired rotation rate, as is known in the art, rotates the mandrel assembly, including the core 123, fins 125, and mandrel 121, the surface of which is used for deposition by the plasma beam. As used herein, references to deposition on the mandrel are intended to include both deposition directly on the mandrel and deposition on something secured to the mandrel. Typically, although not necessarily, a substrate, for example a molybdenum substrate (not shown), will be mounted on the surface of mandrel or platform 121, such as by bolting, and the synthetic diamond film will be deposited on the substrate as it rotates with the mandrel. As known in the art, and although not illustrated, the plasma beam may be considerably smaller than the area on which the diamond is being deposited.

In the illustrated embodiment, two translatable assemblies, 140 and 150, are provided, and each includes at least one, and preferably several (as shown) fins, labelled 141 and 151, respectively, which are spaced apart and parallel, and have respective surfaces that can overlap surfaces of the radiator fins 125; that is, the fins 141 and the fins 151 are adapted to interleave with the fins 125 of the rotating mandrel assembly. In the present embodiment the fins 141 and 151, which may be formed, for example, of copper, are receptor fins, and extend from respective support arms 142 and 152 (which may also be formed of copper) of the translatable assemblies 140 and 150. The support arms 142 and 152 serve as heat exchangers and have heat exchange liquid pass through apertures thereof, represented at 143 and 153, respectively. In the present embodiment the support arms 142 and 143 of the translatable assemblies 140 and 150, respectively, are translatably mounted in respective grooves 144 and 154 (see also FIG. 3) of the bases 146 and 156, which are seated in the lower portion of deposition system 200. The bottom end of each base is slidable in its respective groove, and is translatable by a linear drive (not shown), controlled by servomechanisms represented at 147 and 157, respectively. The apparatus of the illustrated embodiment further includes a top guard plate 133 (which can be separately cooled, by means not shown), used to screen the fins and the motion system from the plasma beam, and a lower guard plate, 131 which can rotate with the rotating mandrel assembly.

FIG. 2 illustrates the mandrel assembly and translating assemblies of FIG. 1, but with the translating assemblies fully withdrawn (i.e., at their radially outward positions) so that there is little or no heat transfer between the fins 125 of the mandrel assembly and the fins 141, 151 of the translating assemblies 140 and 150, respectively. As described further hereinbelow, the positions of the translating assemblies can be adjusted to control the extent of interleave and thereby obtain a desired amount of heat exchange.

Figure 3:
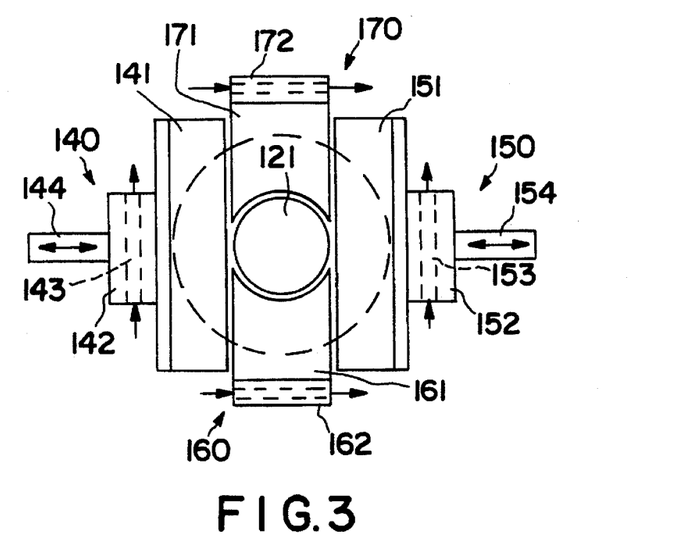
FIG. 3 is a plan view of the mandrel assembly and translatable assemblies of the FIG. 1 embodiment.
Figure 4:
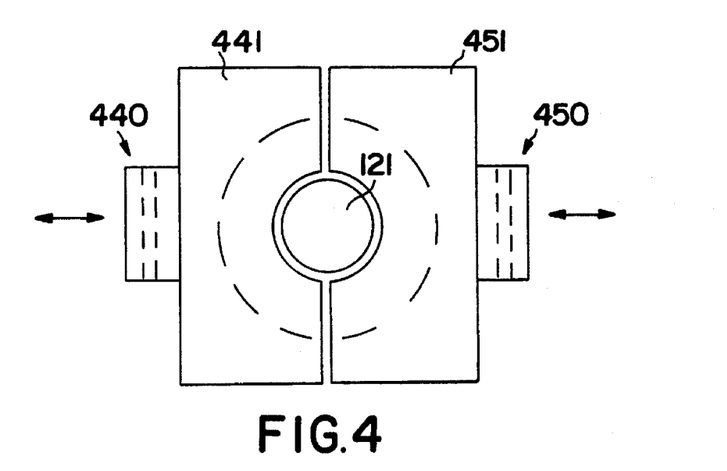
FIG. 4 illustrates another configuration of receptor fins in accordance with a further embodiment of the invention.

FIG. 3 illustrates the shapes of the translating assembly fins 141 and fins 151 of the present embodiment (only the top fin of each assembly being visible in this plan view), and also illustrates the shapes of receptor fins 161 and receptor fins 171 of stationary receptor assemblies 160 and 170 that are used in this embodiment. The stationary receptor assemblies 160 and 170 would appear, in cross-section, similar to their translatable counterparts, 140 and 150. They each include several spaced-apart and parallel fins on respective support arms 162 and 172, the top fins 161 and 171 being visible in FIG. 3. The support arms 162 and 172 serve as heat exchangers and have heat exchange liquid pass through apertures thereof, represented at 163 and 173, respectively. In this configuration, the stationary receptor fins are of a generally rectangular shape, but with curved inner edges to conform to the circular shape of the base of the rotating mandrel assembly, and the translating receptor fins are also of a generally rectangular shape. In the illustrated embodiment, the fins of the stationary receptor assemblies cover about half the rotating fin annulus (shown in dashed line in FIG. 3), and the translating fins, in their fully engaged positions, cover about the other half of the rotating fin annular area. It will be understood that there are many variations possible for the receptor assemblies and fins including, for a translation-adjustable system, without limitation: use of 1, 2, 3, or more translating receptor fin assemblies and 0, 1, 2, or more stationary receptor fin assemblies. As an example, FIG. 4 illustrates an arrangement with no stationary receptor assembly, and two translating assemblies 440 and 450 with receptor fins (top fins 441 and 451, respectively, being visible) having a circular section on the front surface thereof to conform to the base of the rotating mandrel assembly. Again, the fin annulus of the rotating mandrel assembly is shown in dashed line. It will be understood, for example, that one of the assemblies (440 or 450) could be stationary.

In the illustrated embodiment, the degree of engagement by the receptor means are adjusted by an intelligent control loop monitoring the surface temperature of the substrate and adjusting the radiation area to obtain the proper heat transfer to maintain the desired surface temperature. In the illustrated embodiment of FIG. 3, approximately 45% of the total heat transfer area can be adjusted in this manner. [In the case of FIG. 4, 100% of the total heat transfer area can be adjusted, although this would not be necessary for most applications.] The relevant energy balance for the system is:

$$Q_{in} = E_{mandrel} + Q_{out} \quad (1)$$

Initially, energy out of the system can be restricted (e.g. by no heat exchange) to bring the mandrel up to the temperature. Once the mandrel reaches the desired temperature, energy out of the system, $Q_{out}$, should equal energy into the system, $Q_{in}$, for the mandrel temperature to remain constant. Although the actual heat transfer situation is complex because of conduction gradients and efficiencies, energy can be assumed to be radiated from the surfaces of the hot components in accordance with:

$$Q = C^* e^* A^* (T_h^4 - T_c^4) + kA(T_h - T_c) \quad (2)$$

where:
  Q is the heat energy radiation.
  A is the radiation area.
  C is the Stephan-Boltzman Constant.
  e is the emissivity coefficient.
  $T_h$ is the absolute radiator temperature
  $T_c$ is the absolute receptor temperature
  k is the heat tranfer coefficient The supporting thermal mass (mandrel base) and radiation fins will obtain a temperature close to that of the depositional target. The receptor temperature can be maintained at or near a desired relatively low temperature by the circulation of cooling fluids, thereby maximizing the temperature difference term. The emissivity and receptivity of the radiators and receptors can be optimized by using dark, dull coatings. The remaining variable that presents an opportunity for energy regulation is the area, A. The engagement and disengagement of the radiation and receptor fins effectively changes the area and therefore will allow control of $Q_{out}$.

The transfer of heat within the mandrel base can be increased by providing a heat exchange liquid therein of relatively high thermal conductivity, for example, tin, which would be molten at the operating temperature. The heat exchange liquid can also be magnetically stirred.

Figure 5:
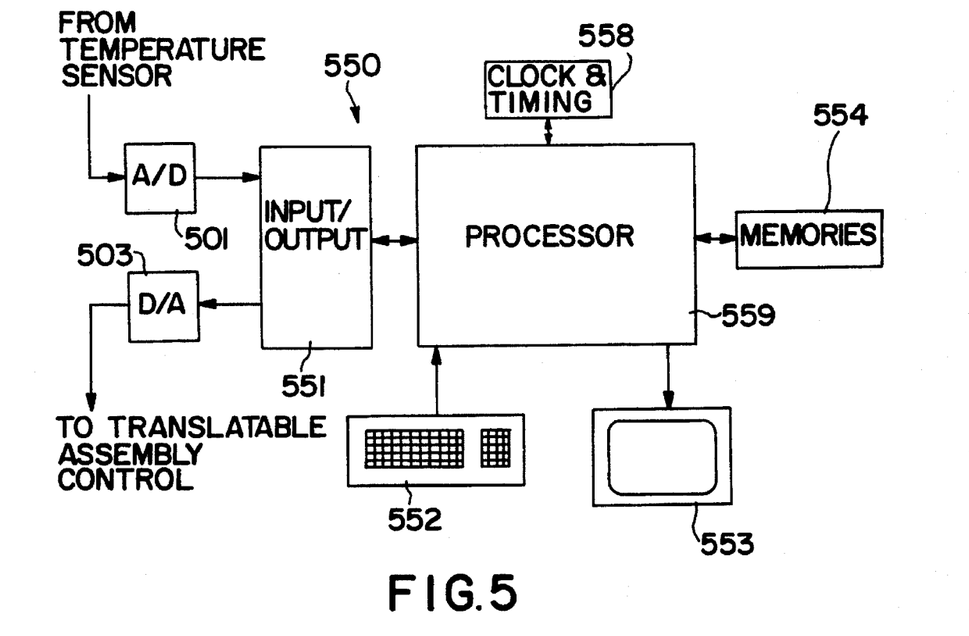
FIG. 5 is a block diagram of control circuitry that can be utilized in accordance with an embodiment of the invention.

In accordance with a feature of the present invention, the temperature at or near the deposition surface [which can be the mandrel surface, the surface of the substrate placed thereon, or the surface of the layer on which deposition is proceeding] can be sensed such as by using a temperature sensor 192 (FIG. 2). The sensor 192 can be positioned as shown in FIG. 2 or, for example, could be placed on the rotatable deposition assembly, with suitable provision for electrical coupling to control circuitry, such as by using a slip ring mechanism. In the present embodiment, the sensor 192 is illustrated as being coupled with control circuitry, an output of which is used to control the translation of translatable receptor assemblies 140 and 150, by controlling the respective servomechanisms 147 and 157 that determine the positions of the translatable receptor assemblies. An embodiment of the control circuitry is illustrated in FIG. 5. The temperature-representative signal is coupled to an analog-to-digital converter 501, the output of which is coupled to a processor subsystem 550 which may, for example, be a personal computer such as one based on an Intel 486 processor (559), and having functions and peripherals that are conventionally employed, including input/output interface 551, keyboard 552, monitor 553, memories 554, and clock and timing circuit 558. The control signal determined by the processor subsystem is coupled to a digital-to-analog converter 503, the output of which is coupled to the servomechanisms 147 and 157 (e.g., FIG. 2). In operation, the signal representative of the sensed temperature is converted to digital form by analog-to-digital converter 501, and then coupled to the processor interface 551. Based on previously stored (or operator-controlled) ideal temperature behavior, the processor subsystem computes a control signal that is coupled from the processor interface to digital-to-analog converter 503, and then to the translatable assemblies. If the servomechanisms are of the type that can be controlled with a digital signal, the digital-to-analog converter 503 would not be necessary.

Figure 6:
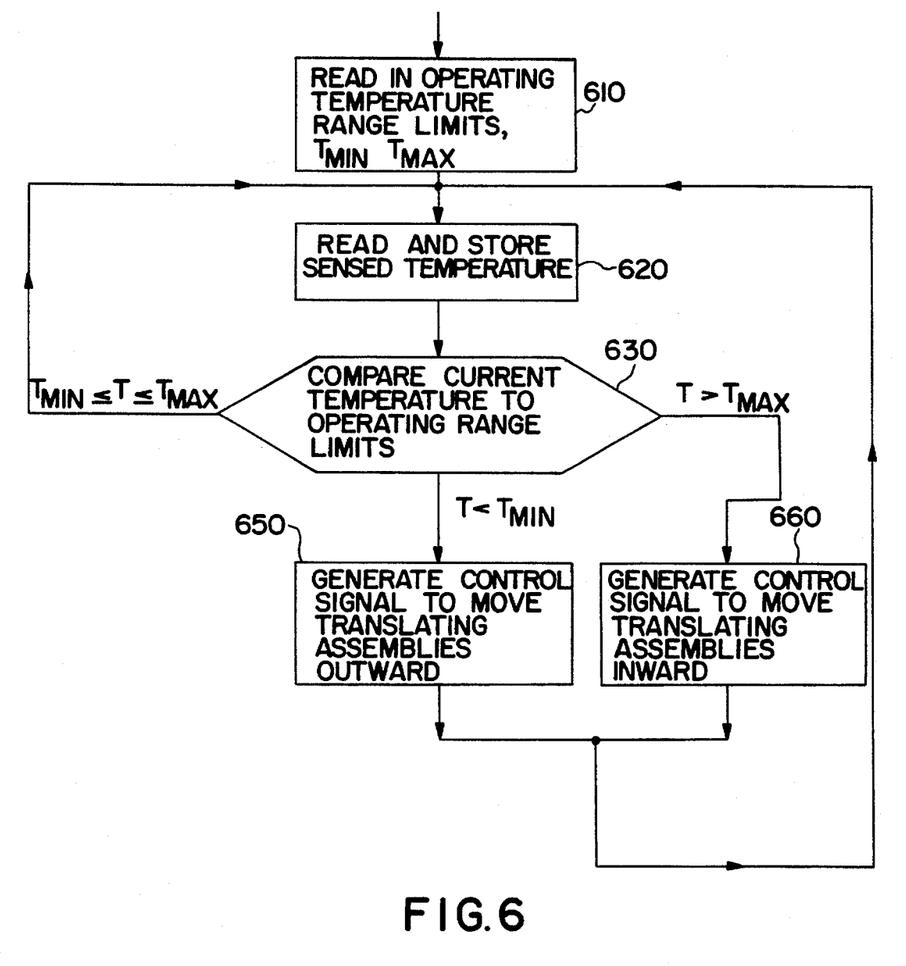
FIG. 6 is a flow diagram of a routine for programming the processor of the FIG. 5 circuitry in accordance with an embodiment of the invention.

Referring to FIG. 6, there is shown a flow diagram of a routine for controlling the processor subsystem 550 of FIG. 5 in accordance with an embodiment of the invention. The desired operating temperature range (e.g. for a given phase of the deposition process), $T_{min}$ to $T_{max}$, is read in, as represented by the block 610. The temperature range can be determined by an operator, or can have been previously stored. Also, it will be understood that the desired temperature or temperature range can vary during the deposition process, and could be controlled as any suitable function of time or measured condition. The block 620 represents the reading and storage of the temperature sensed by the temperature sensor 192 (FIG. 2). Temperature can be sensed continuously and, for example, sampled at a desired sampling rate, the block 620 representing the reading and storage of the current temperature. Determination is then made (decision block 630) as to whether the current temperature (T) is below the specified range ($T<T_{min}$), within the specified range ($T_{min}<T<T_{max}$), or above the specified range ($T>T_{max}$). If the current temperature is within the specified range, no adjustment of the temperature controlling translating receptor assemblies is implemented, and the block 620 is re-entered. If the current temperature is below the specified range, the block 650 is entered, this block representing the generation of a control signal that is operative to cause the translating receptor assemblies to move outward by a predetermined increment, thereby tending to reduce the effective area of opposing radiating and receptor fins, and reducing the heat exchange from the rotating mandrel assembly. If, however, the current temperature is above the specified operating range ($T>T_{max}$), the block 660 is entered, this block representing the generation of a control signal that is operative to cause the translating assemblies to move inward by a predetermined increment, thereby tending to increase the effective area of opposing radiating and receptor fins, and increasing heat exchange (i.e., increasing cooling, in this case). After implementing the control signal generation indicated by the blocks 650 or 660, the block 620 is re-entered for further processing. It will be understood that various other routines could be utilized for controlling the translating assemblies, together or separately, in accordance with the sensed temperature.

Figure 7:
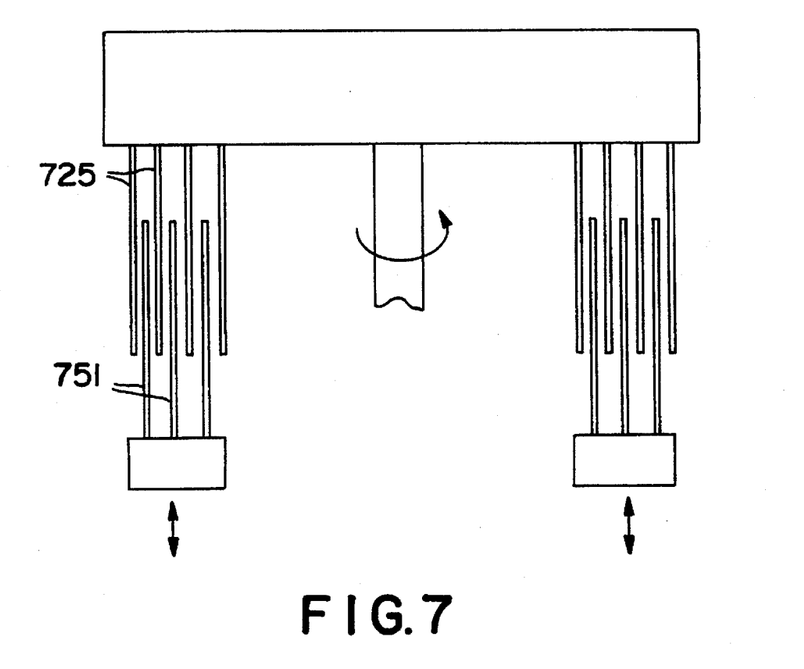
FIG. 7 is a cross-sectional diagram of interleaving fins in accordance with a further embodiment of the invention.

FIG. 7 illustrates a further embodiment of the invention wherein the radiator fins 725 extend from the mandrel in the direction of the axis of rotation of the mandrel. In this embodiment, the receptor fins 751 move in the axial direction. In other respects, operation can be similar to embodiment of FIG. 1. Fins could also be provided at any desired intermediate angle.

Figure 8:
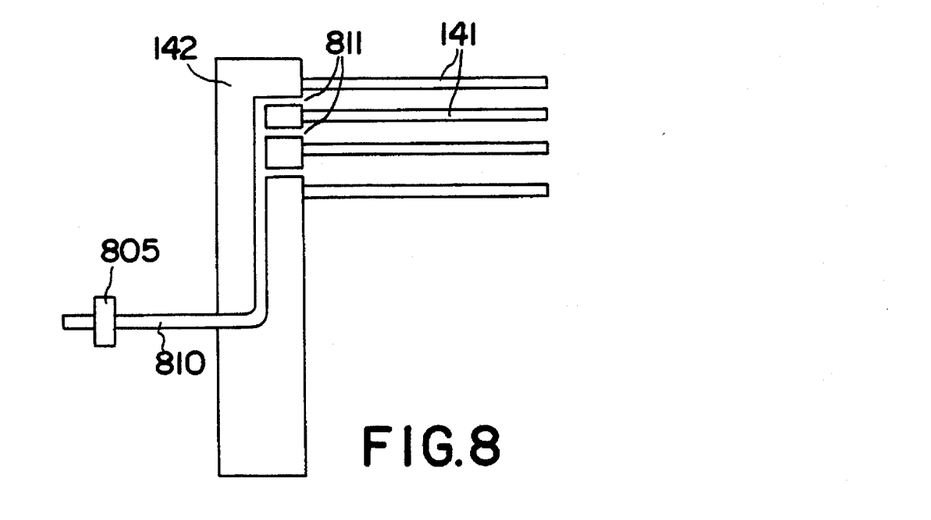
FIG. 8 illustrates a further feature of the invention wherein a gas is injected between radiator and receptor fins.

In accordance with a further feature hereof, the heat transfer between the radiator and receptor fins can be modified (with or without translation of the receptor fins) by changing the thermal conductivity of the gas in the spaces between the fins. During operation as in FIG. 1, hydrogen gas (which comprises most of the environment of the deposition chamber) would normally be in the spaces between the fins. Hydrogen gas has a relatively high thermal conductivity. To temporarily reduce the thermal conductivity between fins (which is one term of the equation (2) above) a gas having a different thermal conductivity can be introduced into the region between the fins. For example, in FIG. 8, a source of argon gas (from a source not shown) is coupled through a valve 805 and a tube 810 which passes through support arm (e.g. the support arm 142 of FIG. 1), the tube 810 branching into branches 811 that have outlets in the regions between the receptor fins 141. When the valve 805 is opened, and argon gas, which has a much lower thermal conductivity than hydrogen at the same temperature and pressure, bleeds into the region between the fins, the thermal conductivity between fins is decreased, thereby reducing heat transfer. When the argon flow is stopped by closing valve 805, the heat transfer (typically, cooling)is increased. For low pressure operation, the pressure of the gas between the fins could also be varied to change thermal conductivity.

The invention has been described with reference to particular preferred embodiments, but variations within the spirit and scope of the invention will occur to those skilled in the art. For example, it is known that the mandrel can be at an angle with respect to the axis of the plasma beam, and this variation can be implemented in conjunction with the principles of present invention. Also, while a cooling function will be typical for most applications, the technique of the invention could also be used for controlled heating.

We claim:

1. Apparatus for depositing a substance, comprising:

a deposition chamber for containing heated constituents of said substance;

a mandrel assembly that includes a mandrel mounted on a base, said mandrel assembly being rotatable on an axis, said mandrel having a surface in said chamber;

said mandrel base having a first fin that extends from said mandrel assembly;

a translatable assembly having a second fin that can overlap said first fin, said translatable assembly being translatable to change the extent of overlap of said first and second fins;

means for rotating said rotatable mandrel assembly;

means for translating said translatable assembly;

heat exchange means coupled with said translatable assembly; and means for controlling the translation of said translatable assembly to control the thermal coupling between said mandrel assembly and said heat exchange means.

2. Apparatus as defined by claim 1, wherein said mandrel base has a plurality of first fins that extend from said mandrel assembly, and wherein said translatable assembly has a plurality of second fins that interleave with said first fins, said translatable assembly being translatable to change the extent of interleaving of said first fins and second fins.

3. Apparatus as defined by claim 2, wherein said plurality of first fins are spaced-apart parallel fins, and wherein said plurality of second fins are spaced-apart parallel fins.

4. Apparatus as defined by claim 3, wherein said mandrel base is generally cylindrical, and said first fins have an annular shape.

5. Apparatus as defined by claim 4, wherein said first fins extend outwardly from the rotation axis of said mandrel assembly.

6. Apparatus as defined by claim 5, further comprising a further translatable assembly having a plurality of further fins that interleave with said first fins; means for translating said further translatable assembly; and heat exchange means coupled with said further translatable assembly.

7. Apparatus as defined by claim 5, further comprising a stationary assembly having a plurality of further fins that interleave with said first fins; means for translating said stationary assembly; and heat exchange means coupled with said stationary assembly.

8. Apparatus as defined by claim 6, further comprising a stationary assembly having a plurality of further fins that interleave with said first fins; means for translating said stationary assembly; and heat exchange means coupled with said stationary assembly.

9. Apparatus as defined by claim 3, wherein said first fins extend from said mandrel in the direction of said axis.

10. Apparatus as defined by claim 1, wherein said heat exchange means comprises means for coupling a heat exchange fluid with said translatable assembly.

11. Apparatus as defined by claim 3, wherein said heat exchange means comprises means for coupling a heat exchange fluid with said translatable assembly.

12. Apparatus for depositing diamond film, comprising:

a deposition chamber for containing a plasma of carbonaceous gas and hydrogen;

a mandrel assembly that includes a mandrel mounted on a base, said mandrel assembly being rotatable on an axis, said mandrel having a surface in said chamber;

said mandrel base having a plurality of spaced-apart parallel radiator fins that extend outwardly from the rotation axis of said mandrel assembly;

a translatable assembly having a plurality of spaced-apart parallel receptor fins that can interleave with said radiator fins, said translatable assembly being translatable to change the extent of interleave between said receptor fins and said radiator fins;

means for rotating said rotatable mandrel assembly;

means for translating said translatable assembly;

heat exchange means coupled with said translatable assembly; and means for controlling the translation of said translatable assembly to control the thermal coupling between said mandrel assembly and said heat exchange means.

13. Apparatus as defined by claim 12, wherein said mandrel base is generally cylindrical, and said first fins have an annular shape.

14. Apparatus as defined by claim 12, further comprising a further translatable assembly having a plurality of further receptor fins that interleave with said radiator fins; means for translating said further translatable assembly; and heat exchange means coupled with said further translatable assembly.

15. Apparatus as defined by claim 13, further comprising a further translatable assembly having a plurality of further receptor fins that interleave with said radiator fins; means for translating said further translatable assembly; and heat exchange means coupled with said further translatable assembly.

16. Apparatus as defined by claim 12, further comprising a stationary assembly having a plurality of further receptor fins that interleave with said radiator fins; means for translating said stationary assembly; and heat exchange means coupled with said stationary assembly.

17. Apparatus as defined by claim 12, wherein said heat exchange means comprises means for coupling a heat exchange fluid with said translatable assembly.

18. Apparatus as defined by claim 1, further comprising means for measuring temperature in the region of said mandrel, and means for controlling said translating means in accordance with the measured temperature.

* * * * *